(12) United States Patent
Maruyama

(10) Patent No.: US 10,459,136 B2
(45) Date of Patent: Oct. 29, 2019

(54) OPTICAL LAMINATE, POLARIZING PLATE AND ORGANIC EL DISPLAY DEVICE

(71) Applicant: FUJIFILM Corporation, Tokyo (JP)

(72) Inventor: Akira Maruyama, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 320 days.

(21) Appl. No.: 15/432,411

(22) Filed: Feb. 14, 2017

(65) Prior Publication Data

US 2017/0153370 A1 Jun. 1, 2017

Related U.S. Application Data

(63) Continuation of application No. PCT/JP2015/073997, filed on Aug. 26, 2015.

(30) Foreign Application Priority Data

Aug. 29, 2014 (JP) .................................. 2014-175935

(51) Int. Cl.
*G02B 5/30* (2006.01)
*C09K 19/38* (2006.01)
(Continued)

(52) U.S. Cl.
CPC ........ *G02B 5/3016* (2013.01); *C09K 19/3809* (2013.01); *C09K 19/3823* (2013.01);
(Continued)

(58) Field of Classification Search
CPC ................ G02B 5/3016; G02B 5/3083; C09K 19/3823; C09K 19/56; C09K 19/3852;
(Continued)

(56) References Cited

U.S. PATENT DOCUMENTS

2008/0138540 A1 6/2008 Omatsu
2010/0157204 A1 6/2010 Ichihashi et al.
(Continued)

FOREIGN PATENT DOCUMENTS

CN 103154786 A 6/2013
CN 103913885 A 7/2014
(Continued)

OTHER PUBLICATIONS

International Preliminary Report on Patentability issued by WIPO dated Mar. 9, 2017, in connection with international Patent Application No. PCT/JP2015/073997.
(Continued)

*Primary Examiner* — Eli D. Strah
(74) *Attorney, Agent, or Firm* — Edwards Neils LLC; Jean C. Edwards, Esq.

(57) ABSTRACT

The present invention provides an optical laminate in which cissing occurring when an optically anisotropic layer is formed and film thickness unevenness are suppressed, and a polarizing plate and an organic EL display device using the same. The optical laminate includes an optically anisotropic layer A, and an optically anisotropic layer B, where layer A and layer B come into direct contact, either or both of layer A and layer B are formed of a composition containing a liquid crystal compound, surface energy A of a surface of layer A on a side in contact with layer B is 30 to 40 mN/m, surface energy B1 of a surface of layer B on a side in contact with layer A is 35 mN/m or more, and surface energy B2 of a surface of layer B opposite to the side in contact with layer A is 25 mN/m or less.

14 Claims, 3 Drawing Sheets

(51) Int. Cl.
| | | |
|---|---|---|
| *C09K 19/56* | (2006.01) | |
| *H01L 51/52* | (2006.01) | |
| *B32B 7/023* | (2019.01) | |
| *G02F 1/13363* | (2006.01) | |
| *G02F 1/1335* | (2006.01) | |
| *C09K 19/04* | (2006.01) | |
| *C09K 19/20* | (2006.01) | |

(52) U.S. Cl.
CPC .......... *C09K 19/3852* (2013.01); *C09K 19/56* (2013.01); *G02B 5/3083* (2013.01); *H01L 51/5281* (2013.01); *B32B 7/023* (2019.01); *B32B 2457/20* (2013.01); *B32B 2457/202* (2013.01); *B32B 2457/206* (2013.01); *C09K 2019/0448* (2013.01); *C09K 2019/2035* (2013.01); *C09K 2019/2078* (2013.01); *C09K 2219/03* (2013.01); *G02F 1/13363* (2013.01); *G02F 1/133528* (2013.01); *G02F 2001/133638* (2013.01); *Y10T 428/1041* (2015.01)

(58) Field of Classification Search
CPC ........ C09K 19/3809; C09K 2019/2078; C09K 2019/2035; C09K 2019/0448; C09K 2219/03; H01L 51/5281; G02F 1/133528; G02F 1/13363; G02F 2001/133638; Y10T 428/1041; B32B 7/023; B32B 2457/20; B32B 2457/202; B32B 2457/206
See application file for complete search history.

(56) References Cited

U.S. PATENT DOCUMENTS

| | | | |
|---|---|---|---|
| 2013/0222910 A1* | 8/2013 | Yoneyama | G02B 5/3025 359/489.07 |
| 2014/0184988 A1 | 7/2014 | Sato et al. | |
| 2014/0375935 A1 | 12/2014 | Yamada et al. | |

FOREIGN PATENT DOCUMENTS

| | | | | |
|---|---|---|---|---|
| JP | 2002-258046 A | | 9/2002 | |
| JP | 2005084277 A | * | 3/2005 | |
| JP | 2006-117909 A | | 5/2006 | |
| JP | 2006297831 A | * | 11/2006 | |
| JP | 2008-282009 A1 | | 11/2008 | |
| JP | 2009-193046 A | | 8/2009 | |
| JP | 2012-103689 A | | 5/2012 | |
| JP | 2014-142618 A | | 8/2014 | |
| KR | 10-2007-0094795 A | | 9/2007 | |
| WO | 2013/137464 | | 9/2013 | |
| WO | 2014/073616 A1 | | 5/2014 | |
| WO | WO-2014073616 A1 | * | 5/2014 | .......... G02B 5/3016 |

OTHER PUBLICATIONS

Notification of Reason for Refusal issued by the Korean Intellectual Property Office dated Jan. 9, 2018, in connection with Korean Patent Application No. 10-2017-7002974.

Office Action issued by the State Intellectual Property Office of People's Republic of China dated Jul. 2, 2018 in connection with the corresponding Chinese Patent Application No. 201580044878.8.

International Search Report issued in PCT/JP2015/073997 dated Nov. 24, 2015.

Notification of Reasons for Refusal issued by the Japanese Patent Office dated Oct. 3, 2017, in connection with Japanese Patent Application No. 2016-545575.

Office Action issued by the Japanese Patent Office dated Aug. 7, 2018, in connection with corresponding Japanese Patent Application No. 2016-545575.

Office Action, issued by the State Intellectual Property Office dated Apr. 9, 2019, in connection with corresponding Patent Application No. 201580044878.8.

* cited by examiner

OPTICAL LAMINATE, POLARIZING PLATE AND ORGANIC EL DISPLAY DEVICE

CROSS-REFERENCE TO RELATED APPLICATIONS

This application is a Continuation of PCT International Application No. PCT/JP2015/073997 filed on Aug. 26, 2015, which claims priority under 35 U.S.C. § 119(a) to Japanese Patent Application No. 2014-175935 filed on Aug. 29, 2014. The above application is hereby expressly incorporated by reference, in its entirety, into the present application.

BACKGROUND OF THE INVENTION

1. Field of the Invention

The present invention relates to an optical laminate, a polarizing plate, and an organic EL display device.

2. Description of the Related Art

A phase difference plate has very numerous applications and is already used for a reflective type liquid crystal display (LCD), a semi-transmissive type LCD, a brightness enhancement film, an organic electroluminescence (EL) display device, a touch panel, and the like. For example, since an organic EL display device has a structure in which layers having different refractive indexes are laminated or a structure in which metal electrodes are used, there arises a problem that external light is reflected in the interfaces of each of these layers to cause a reduction in contrast and reflected glare, or the like. Therefore, conventionally, in order to suppress an adverse effect caused by reflection of external light, a polarizing plate composed of a phase difference plate and a polarizing film is used in an organic EL display device, an LCD display device, and the like.

For example, WO2014/073616A discloses a phase difference plate including a transparent support, and a laminated optically anisotropic layer having a first optically anisotropic layer (H) which is formed of a composition containing a discotic liquid crystal compound represented by a predetermined structural formula, and a second optically anisotropic layer (Q) which is formed of a composition containing a rod-like liquid crystal compound ([claim 1]).

In addition, WO2013/137464A discloses, as an embodiment of an organic EL display device, an organic EL display device including at least a polarizer layer, a transparent support layer of one or more layers, a λ/2 plate composed of a layer containing a discotic liquid crystal compound, a λ/4 plate composed of a layer containing a discotic liquid crystal compound, and an organic EL panel in this order ([claim 7]).

SUMMARY OF THE INVENTION

When the present inventor has investigated a conventionally known optical laminate such as the laminated optically anisotropic layer disclosed in WO2014/073616A or the laminate of the λ/2 plate and the λ/4 plate disclosed in WO2013/137464A, it has been found that in an embodiment in which optically anisotropic layers come into direct contact with each other, there is a case in which cissing occurs when a second optically anisotropic layer is formed or film thickness unevenness is generated in an optically anisotropic layer to be formed.

An object of the present invention is to provide an optical laminate in which cissing occurring when an optically anisotropic layer is formed and film thickness unevenness are suppressed, and a polarizing plate and an organic EL display device using the same.

As a result of intensive investigations to solve the above problems, the present inventor has found that by increasing the surface energy of the interface between the optically anisotropic layers in direct contact with each other and decreasing the surface energy of the surface of one optically anisotropic layer opposite to the side in contact with the other optically anisotropic layer, that is, the surface which becomes an air interface side when the second optically anisotropic layer is formed, cissing and film thickness unevenness are suppressed, thus having completed the present invention.

That is, it has been found that the above object can be achieved by adopting the following configurations.

[1] An optical laminate comprising: an optically anisotropic layer A; and an optically anisotropic layer B, in which the optically anisotropic layer A and the optically anisotropic layer B come into direct contact with each other, either or both of the optically anisotropic layer A and the optically anisotropic layer B are formed of a composition containing a liquid crystal compound, surface energy A of a surface of the optically anisotropic layer A on a side in contact with the optically anisotropic layer B is 30 to 40 mN/m, surface energy B1 of a surface of the optically anisotropic layer B on a side in contact with the optically anisotropic layer A is 35 mN/m or more, and surface energy B2 of a surface of the optically anisotropic layer B opposite to the side in contact with the optically anisotropic layer A is 25 mN/m or less.

[2] The optical laminate according to [1], further comprising: a transparent support, in which the optical laminate includes the transparent support, the optically anisotropic layer A, and the optically anisotropic layer B in this order.

[3] The optical laminate according to [2], in which the optically anisotropic layer B is formed of a composition containing a liquid crystal compound.

[4] The optical laminate according to [2], in which the optically anisotropic layer B is formed of a composition containing a liquid crystal compound, the liquid crystal compound has a polymerizable group, and the composition contains a non-liquid crystal monomer having the same polymerizable group as the polymerizable group of the liquid crystal compound.

[5] The optical laminate according to [4], in which the polymerizable group is an acryloyloxy group or a methacryloyloxy group.

[6] The optical laminate according to any one of [1] to [5], in which a difference between the surface energy B1 and the surface energy B2 of the optically anisotropic layer B is 17 mN/m or more.

[7] A polarizing plate comprising: the optical laminate according to any one of [1] to [6]; and a polarizing film.

[8] An organic EL display device comprising: the optical laminate according to any one of [1] to [6] or the polarizing plate according to [7].

According to the present invention, it is possible to provide an optical laminate in which cissing occurring when an optically anisotropic layer is formed and film thickness unevenness are suppressed, and a polarizing plate and an organic EL display device using the same.

DESCRIPTION OF THE PREFERRED EMBODIMENTS

Figure 1:
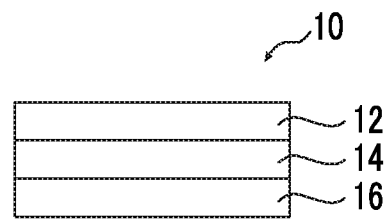
FIG. 1 is a schematic cross-sectional view showing an example of an embodiment of an optical laminate according to the present invention.

Hereinafter, the present invention will be described in detail.

The following description of the constitutional requirements is made on the basis of representative embodiments of the present invention, but it should not be construed that the present invention is limited to those embodiments.

The numerical range which is shown by "to" used in the present specification means the range including the numerical values described before and after "to" as the lower limit and the upper limit, respectively.

Next, the terms used in the present specification will be described.

$Re(\lambda)$ and $Rth(\lambda)$ represent the in-plane retardation at a wavelength $\lambda$ and the retardation in a thickness direction, respectively. $Re(\lambda)$ is measured by applying light having a wavelength of $\lambda$ nm to a film in the normal direction of the film, in KOBRA 21ADH or KOBRA WR (both manufactured by Oji Scientific Instruments). A measurement wavelength $\lambda$ nm can be selected by manually replacing a wavelength selective filter, or, the measured value can be converted by using a program or the like. The method for measuring $Re(\lambda)$ and $Rth(\lambda)$ is described in detail in paragraphs 0010 to 0012 of JP2013-041213A, the content of which is incorporated in the present specification by reference.

In the present specification, in a case in which there is no particular description regarding the measurement wavelength, the measurement wavelength is 550 nm.

Furthermore, in the present specification, an angle (for example, an angle of "90°") and an angular relationship (for example, "orthogonal", "parallel", "the same direction", and "crossing at 45°") include the margin of allowable error in the field of the related art to which the present invention belongs. At this time, the allowable error means that the margin of the error is less than a precise angle ±100. Specifically, a difference between an actual angle and the precise angle is preferably 50 or less, and more preferably 3° or less.

[Optical Laminate]

The optical laminate of the present invention is an optical laminate having an optically anisotropic layer A and an optically anisotropic layer B, the optically anisotropic layer A and the optically anisotropic layer B come into direct contact with each other, and either or both of the optically anisotropic layer A and the optically anisotropic layer B are formed of a composition containing a liquid crystal compound.

In addition, in the optical laminate of the present invention, the surface energy A of the surface of the optically anisotropic layer A on the side in contact with the optically anisotropic layer B (hereinafter, also referred to as a "ZA front surface") is 30 to 40 mN/m, and the surface energy B1 of the surface of the optically anisotropic layer B on the side in contact with the optically anisotropic layer A (hereinafter, also referred to as a "ZB rear surface") is 35 mN/m or more.

Further, in the optical laminate of the present invention, the surface energy B2 of the surface of the optically anisotropic layer B opposite to the side in contact with the optically anisotropic layer A (hereinafter, also referred to as a "ZB front surface") is 25 mN/m or less.

In the present invention, an optical laminate is obtained in which cissing occurring when the optically anisotropic layer is formed and film thickness unevenness are suppressed by adopting the above-described configuration.

Although the details are not clear, the reason why cissing occurring when an optically anisotropic layer is formed and film thickness unevenness are suppressed is assumed as follows.

Conventionally, it has been considered that in order for an optical laminate to suppress cissing of an upper layer when liquid crystal layers are laminated, for example, the surface tension of the upper layer (a layer to be applied) may be lowered or the surface energy of the lower layer (an applied layer) may be increased.

In contrast, as described above, in the present invention, it is found that when the surface energy B2 of the ZB front surface is lowered and the surface energy of the interface, that is, the surface energy B1 of the ZB rear surface and the surface energy A of the ZA front surface is maintained in predetermined ranges at a high level, cissing is suppressed.

That is, it is considered that since the surface energy of the interface between the ZB rear surface and the ZA front surface is high and uneven distribution of an additive (such as an alignment controlling agent or a surfactant) in the vicinity of the interface is suppressed, cissing and film thickness unevenness are suppressed.

FIG. 1 is a cross-sectional view schematically showing an example of an embodiment of the optical laminate according to the present invention.

An optical laminate 10 shown in FIG. 1 has an optically anisotropic layer (A) 14 and an optically anisotropic layer (B) 16 which come into direct contact with each other.

As shown in FIG. 1, the optical laminate 10 may have a transparent support 12 and preferably has the transparent support 12, the optically anisotropic layer (A) 14, and the optically anisotropic layer (B) 16 in this order as shown in FIG. 1.

Hereinafter, each layer constituting the optical laminate of the present invention will be described in detail.

[Optically Anisotropic Layers A and B]

The optically anisotropic layers A and B that the optical laminate of the present invention has come into direct contact with each other, and either or both of the optically anisotropic layers are formed of a composition containing a liquid crystal compound (hereinafter, also referred to as "liquid crystal composition").

Here, the liquid crystal composition is as described later. However, in the case in which only one of the optically anisotropic layer A and the optically anisotropic layer B (for example, the optically anisotropic layer B) is formed of a liquid crystal composition, an optically anisotropic layer formed of another material other than the liquid crystal composition can be formed by appropriately selecting a material for forming the transparent support which will be described later.

<Surface Energy>

In the optical laminate of the present invention, the surface energy A of the surface of the optically anisotropic layer A on the side in contact with the optically anisotropic layer B (ZA front surface) is 30 to 40 mN/m, preferably 31 to 38 mN/m, and more preferably 32 to 35 mN/m.

In addition, the surface energy B1 of the surface of the optically anisotropic layer B on the side in contact with the optically anisotropic layer A (ZB rear surface) is 35 mN/m or more, preferably 35 to 42 mN/m, and more preferably 36 to 41 mN/m.

Further, the surface energy B2 of the surface of the optically anisotropic layer B opposite to the side in contact with the optically anisotropic layer A (ZB front surface) is 25 mN/m or less, preferably 17 to 25 mN/m, and more preferably 17 to 23 mN/m.

Here, the surface energy ($\gamma s^v$: unit, mN/m) of each of the ZA front surface, the ZB front surface, and the ZB rear surface can be experimentally obtained from each surface of a sample which is an object to be measured using pure water $H_2O$ and iodide methylene $CH_2I_2$ while referring to D. K. Owens: J. Appl. Polym. Sci., 13, 1741 (1969). At this time, the surface energy is defined as a value $\gamma s^v$ ($=\gamma s^d + \gamma s^h$) which is a sum of $\gamma s^d$ and $\gamma s^h$ obtained from the following simultaneous equations (A) and (B) as respective contact angles $\theta_{H2O}$ and $\theta_{CH2I2}$ of pure water and iodide methylene. In addition, as the contact angle, a value obtained by controlling the humidity in an environment of at a temperature of 20° C. to 27° C. and a relative humidity of 50% to 65% for 2 hours or longer and then measuring the contact angle in an environment of a temperature of 25° C. and a relative humidity of 60% is adopted and the contact angle can be measured using a contact angle meter (for example, DROP-MASTER (manufactured by KYOWA INTERFACE SCIENCE CO., LTD.)).

$$1+\cos\theta_{H2O}=2\sqrt{\gamma s^d}(\sqrt{\gamma_{H2O}^d/\gamma_{H2O}^v})+2\sqrt{\gamma s^h}(\sqrt{\gamma_{H2O}^h/\gamma_{H2O}^v}) \quad (A)$$

$$1+\cos\theta_{CH2I2}=2\sqrt{\gamma s^d}(\sqrt{\gamma_{CH2I2}^d/\gamma_{CH2I2}^v})+2\sqrt{\gamma s^h}(\sqrt{\gamma_{CH2I2}^h/\gamma_{CH2I2}^v}) \quad (B)$$

(here, $\gamma_{H2O}^d=21.8$, $\gamma_{H2O}^h=51.0$, $\gamma_{H2O}^v=72.8$, $\gamma_{CH2I2}^d=49.5$, $\gamma_{CH2I2}^h=1.3$, and $\gamma_{CH2I2}^v=50.8$.)

In addition, a peeling method of exposing the front surface or the rear surface of the optically anisotropic layer from the prepared optical laminate may be any of the following methods.

(a) A cut is formed between the optically anisotropic layers (at the interface) on the cross section of the optical laminate using a cutter and a peeling starting point (starting point) is formed. Then, an adhesive (SK-2057, manufactured by Soken Chemical & Engineering Co., Ltd.) is attached to and peeled off from the air interface side of the optically anisotropic layer in which the starting point is formed.

(b) In the case in which the optically anisotropic layer cannot be peeled off by the method of the above (a), the optical laminate in which a cut is formed is put in an environment of a temperature of 85° C. and a relative humidity of 85% for 15 days or longer, and then the optically anisotropic layer is peeled off by the same method as the above (a).

In the present invention, since cissing occurring when the optically anisotropic layer is formed is further suppressed, a difference between the surface energy B1 and the surface energy B2 of the optically anisotropic layer B is preferably 17 mN/m or more and more preferably 20 mN/m or more.

<Liquid Crystal Composition>

In the present invention, since the aforementioned surface energy is easily adjusted and cissing occurring when the optically anisotropic layer is formed is further suppressed, it is preferable that out of the optically anisotropic layers A and B, at least an optically anisotropic layer, which is formed later, is preferably formed of a liquid crystal composition, it is more preferable that the optically anisotropic layer B is formed of a liquid crystal composition, and it is even more preferable that both the optically anisotropic layers A and B are formed of a liquid crystal composition.

Specifically, for example, as such a liquid crystal composition, a liquid crystal composition containing a liquid crystal compound, an alignment controlling agent, a non-liquid crystal monomer, and a solvent, which will be described later, can be used.

(Liquid Crystal Compound)

Generally, the liquid crystal compound can be classified into a rod type and a disk type based on the shape thereof. Further, each of the rod type and the disk type includes a low molecular weight type and a polymer type. Generally, a polymer refers to a molecule having a degree of polymerization of equal to or greater than 100 ("Polymer Physics Dynamics of Phase Transition", Masao Doi, p. 2, Iwanami Shoten, Publishers., 1992). In the present invention, any of the liquid crystal compounds can be used, but it is preferable to use a rod-like liquid crystal compound (hereinafter, also abbreviated as "CLC" or "CLC compound") or a discotic liquid crystal compound (disk-like liquid crystal compound) (hereinafter, also abbreviated as "DLC" or "DLC compound"). Two or more types of rod-like liquid crystal compounds, two or more types of disk-like liquid crystal compounds, or a mixture of a rod-like liquid crystal compound and a disk-like liquid crystal compound may be used. In order to fix the aforementioned liquid crystal compound, the optically anisotropic layer is more preferably formed by using a rod-like liquid crystal compound or a disk-like liquid crystal compound having a polymerizable group. Even more preferably, the liquid crystal compound has two or more polymerizable groups in a single molecule. When the liquid crystal compound is a mixture of two or more types thereof, it is preferable that at least one type of liquid crystal compound has two or more polymerizable groups in a single molecule.

As the rod-like liquid crystal compound, for example, it is possible to preferably use those described in claim 1 of JP1999-513019A (JP-H11-513019A) or in paragraphs [0026] to [0098] of JP2005-289980A. As the discotic liquid crystal compound, for example, it is possible to preferably use those described in paragraphs [0020] to [0067] of JP2007-108732A or in paragraphs [0013] to [0108] of JP2010-244038A. However, the present invention is not limited thereto.

The polymerizable group is not particularly limited as long as the polymerizable group can cause polymerization and crosslinking reaction by active rays, an electron beam, heat, or the like. Examples thereof include a polymerizable ethylenically unsaturated group and a ring polymerizable group. Specific examples thereof include a (meth)acryloyloxy group, a vinyl group, a styryl group, and an allyl group. Among these, a (meth)acryloyloxy group is preferable. The term "(meth)acryloyloxy group" is a comprehensive expression of an acryloyloxy group or a methacryloyloxy group, and the term "(meth)acrylate", which will be described later, is a comprehensive expression of acrylate or methacrylate.

The molecules of the liquid crystal compound are preferably fixed in any of the alignment states including vertical alignment, horizontal alignment, hybrid alignment, and tilt alignment.

Here, the hybrid alignment is an alignment state in which the angle formed between the plane of the disk of the disk-like liquid crystal compound molecule or the molecule symmetry axis of the rod-like liquid crystal compound molecule and the plane of the layer increases or decreases in the depth direction of the optically anisotropic layer as the distance from the surface of the alignment film increases.

The aforementioned angle preferably increases as the distance increases.

Furthermore, the mode of change of the angle includes continuous increase, continuous decrease, intermittent increase, intermittent decrease, and a combination of continuous increase and continuous decrease. Alternatively, the mode of change can also be intermittent change including increase and decrease. The mode of intermittent change includes a region in which the tilt angle does not change in the middle of the thickness direction.

The aforementioned angle may not change in a certain region as long as the angle increases or decreases as a whole. However, the angle preferably changes continuously. Needless to say, an alignment state may also be adopted in which all the liquid crystal compound molecules are uniformly tilted.

As the embodiment in which the liquid crystal compound is fixed in the hybrid alignment state as described above, an embodiment in which the optically anisotropic layer is used as an optical compensation film of a liquid crystal display device adopting a twisted alignment mode is exemplified. Specifically, those described in paragraphs [0123] to [0126] of JP2012-3183A can be used, but the present invention is not limited thereto.

On the other hand, the alignment state of the liquid crystal compound is controlled to make the optically anisotropic layer function as λ/4 plate.

Here, the λ/4 plate (a plate having λ/4 function) is a plate having a function of converting linearly polarized light at a specific wavelength into circularly polarized light (or converting circularly polarized light into linearly polarized light). More specifically, it is a plate in which a value of in-plane retardation at a predetermined wavelength λ nm becomes λ/4 (or an odd multiple thereof).

Since the optical laminate of the present invention has the optically anisotropic layers A and B, as the λ/4 plate, a broadband λ/4 plate composed of a λ/4 plate and a λ/2 plate laminated on each other is exemplified. In the broadband λ/4 plate, an angle formed between the in-plane slow axis of the λ/4 plate and the in-plane slow axis of the λ/2 plate is preferably 60°.

The material constituting the λ/4 plate is not particularly limited as long as it exhibits the characteristics described above. As the material, an embodiment in which the λ/4 plate contains a liquid crystal compound as described above for the aforementioned optically anisotropic layer (for example, an optically anisotropic layer containing a homogeneously aligned liquid crystal compound), a polymer film, and the like are exemplified. Among these, from the viewpoint of easily controlling the aforementioned characteristics, the λ/4 plate preferably contains a liquid crystal compound. More specifically, the λ/4 plate is preferably a layer formed by fixing a liquid crystal compound (a rod-like liquid crystal compound or a discotic liquid crystal compound) having a polymerizable group by means of polymerization or the like. In this case, after being formed into a layer by fixing, the liquid crystal compound does not need to exhibit liquid crystallinity.

At this time, in the case in which a rod-like liquid crystal compound is used, the rod-like liquid crystal compound is preferably fixed in a horizontal alignment state. In the case in which a discotic liquid crystal compound is used, the discotic liquid crystal compound is preferably fixed in a vertical alignment state. Herein, in the present invention, the phrase "the rod-like liquid crystal compound is in a horizontal alignment state" means that a director of the rod-like liquid crystal compound is parallel to the plane of the layer. In addition, the phrase "the discotic liquid crystal compound is in a vertical alignment state" means that the plane of the disk of the discotic liquid crystal compound is perpendicular to the plane of the layer. However, the phrases do not mean that the liquid crystal compound needs to be precisely horizontally or vertically aligned, but means that there may be a difference within a range of ±20° from the precise angle. The difference is preferably within ±5°, more preferably within ±3°, even more preferably within ±2°, and most preferably within ±10.

The method of forming the λ/4 plate is not particularly limited, and a known method can be adopted. For example, a method of producing a broadband λ/4 plate described in paragraph [0097] of JP2004-238431A and a method of producing a phase difference plate described in paragraphs [0129] to [0136] of WO2014/073616A may be used.

(Alignment Controlling Agent)

In order to put the aforementioned liquid crystal compound in the horizontal alignment state or the vertical alignment state, it is preferable that the liquid crystal composition contains an alignment controlling agent accelerating the horizontal alignment or the vertical alignment.

As a compound for accelerating vertical alignment of molecules of the liquid crystal compound on the alignment film interface side (alignment film interface side vertical aligning agent), a pyridinium derivative is suitably used.

As a compound for accelerating vertical alignment of molecules of the liquid crystal compound on the air interface side (air interface side vertical aligning agent), a compound including one or more hydrophilic groups selected from the group consisting of a fluoroaliphatic group, a carboxyl group (—COOH), a sulfo group (—SO$_3$H), a phosphonoxy group {—OP(=O)(OH)$_2$}, and salts thereof, which accelerates uneven distribution of this compound on the air interface side, is suitably used.

As these alignment controlling agents, known compounds may be appropriately used. Examples of the alignment film interface side vertical aligning agent include compounds described in paragraphs [0086] to [0101] of WO2014/073616A, and examples of the air interface side vertical aligning agent include compounds described in paragraphs [0102] to [0113] of WO2014/073616A, the contents of which are incorporated in the present specification by reference.

In addition, as another example of the alignment controlling agents, a polymer defined in claim 14 of JP2008-257205A (that is, a polymer including a constitutional unit represented by the following Formula (A) and a constitutional unit represented by the following Formula (B)), and a tilt angle controlling agent described in claim 15 of JP2008-257205A (that is, a polymer including a constitutional unit represented by the following Formula (A) and a constitutional unit derived from a fluoroaliphatic group-containing monomer) can be used. Specific examples thereof include polymers described in paragraphs [0023] to [0063] of JP2008-257205A, the content of which is incorporated in the present specification by reference.

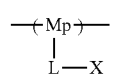

Formula (A)

-continued

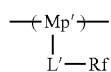

Formula (B)

In Formula (A), Mp represents a trivalent group constituting a part of the main chain of a polymer; L represents a single bond or a divalent linking group; and X represents a substituted or non-substituted aromatic condensed ring functional group; and in Formula (B), Mp' represents a trivalent group constituting a part of the main chain of a polymer; L' represents a single bond or a divalent linking group; and Rf represents a substituent containing at least one fluorine atom.

In the present invention, in the case in which the optically anisotropic layer B is formed from a liquid crystal composition, as the alignment controlling agent, it is preferable to use a polymer including a constitutional unit represented by the above Formula (A) and a constitutional unit derived from a fluoroaliphatic group-containing monomer, and it is more preferable to use a polymer including a constitutional unit represented by the above Formula (A) and a constitutional unit represented by the above Formula (B).

In addition, in the case of using such a polymer, the content of a repeating unit derived from a fluoroaliphatic group-containing monomer (preferably a constitutional unit represented by Formula (B)) is preferably 5% to 90% by mass and more preferably 40% to 80% by mass.

In the present invention, the content of the alignment controlling agent is 0.005% to 8% by mass and more preferably 0.01% to 5% by mass with respect to the total solid content of the liquid crystal composition.

(Non-Liquid Crystal Monomer)

It is preferable that the liquid crystal composition contains a non-liquid crystal monomer from the viewpoint of easily controlling the surface energy of an optically anisotropic layer to be formed, and in the case in which the aforementioned liquid crystal compound has a polymerizable group, it is more preferable that the liquid crystal composition contains a non-liquid crystal monomer having the same polymerizable group as this polymerizable group.

Here, examples of the polymerizable group includes the polymerizable groups exemplified in the description of the aforementioned liquid crystal compound and among these, a (meth)acryloyloxy group is preferable.

Specific examples of a non-liquid crystal monomer having a (meth)acryloyloxy group include ethylene glycol di(meth)acrylate, butylene glycol di(meth)acrylate, trimethylolpropane di(meth)acrylate, trimethylolpropane tri(meth)acrylate, hexanediol di(meth)acrylate, origoethylene di(meth)acrylate, and modified products thereof (for example, ethylene oxide-modified product). These may be used alone or in combination of two or more thereof.

In the present invention, the content of the non-liquid crystal monomer is preferably 0.1% to 15% by mass and more preferably 1% to 10% by mass with respect to the total solid content of the liquid crystal composition.

(Polymerization Initiator)

It is preferable that the liquid crystal composition causes the liquid crystal compound to polymerize using a polymerization initiator from the viewpoint of maintaining and fixing the alignment state of the aforementioned liquid crystal compound.

The polymerization initiator to be used may adopt a thermal polymerization initiator or a photopolymerization initiator according to the polymerization reaction system.

Examples of the photopolymerization initiator include α-carbonyl compounds, acyloinethers, α-hydrocarbon-substituted aromatic acyloin compounds, polynuclear quinone compounds, a combination of triarylimidazole dimer and p-aminophenyl ketone, acridine and phenazine compounds, and oxadiazole compounds.

The amount of the polymerization initiator to be used is preferably 0.01% by mass to 20% by mass and more preferably 0.5% by mass to 5% by mass with respect to the total solid content of the liquid crystal composition.

(Solvent)

The liquid crystal composition may include a solvent and an organic solvent is preferably used.

Specific examples of the organic solvent include amides (for example, N,N-dimethylformamide), sulfoxides (for example, dimethylsulfoxide), heterocyclic compounds (for example, pyridine), hydrocarbons (for example, benzene, hexane), alkyl halides (for example, chloroform, and dichloromethane), esters (for example, methyl acetate, ethyl acetate, and butyl acetate), ketones (for example, acetone, and methyl ethyl ketone), ethers (for example, tetrahydrofuran, and 1,2-dimethoxyethane). These solvents may be used alone or in combination of two or more thereof.

Among these, alkyl halides and ketones are preferable.

(Other Additives)

In the present invention, by using a plasticizer, a surfactant, and the like together with the aforementioned liquid crystal compound, the uniformity of the coating film, the strength of the film, the alignment of the liquid crystal compound, and the like can be improved.

As a surfactant, conventionally known compounds may be used and particularly a fluorine-based compound is preferable. Specific examples thereof include compounds described in paragraphs [0028] to [0056] of JP2001-330725A, and compounds described in paragraphs [0069] to [0126] of JP2005-062673A.

[Transparent Support]

The optical laminate of the present invention may have a transparent support which supports the aforementioned optically anisotropic layer A and optically anisotropic layer B. In the case of the optical laminate having a transparent support, it is preferable that the optical laminate of the present invention has the transparent support, the optically anisotropic layer A, and the optically anisotropic layer B in this order as shown in FIG. 1.

The material for forming the transparent support is preferably a polymer that is excellent in optical transparency, mechanical strength, heat stability, moisture shielding properties, isotropy, and the like. The term "transparent" used in the present invention denotes that transmittance of visible light is 60% or more, preferably 80% or more, and particularly preferably 90% or more.

Examples of the polymer that can be used for the transparent support include cellulose-based polymers; acrylic polymers having an acrylic ester polymer such as polymethyl methacrylate and a lactone-ring containing polymer; thermoplastic norbornene-based polymers; polycarbonate-based polymers; polyester-based polymers such as polyethylene terephthalate and polyethylene naphthalate; styrene-based polymers such as polystyrene and an acrylonitrile-styrene copolymer (AS resin); polyolefin-based polymers such as polyethylene, polypropylene, and an ethylene-propylene copolymer; vinyl chloride-based polymers; amide-based polymers such as nylon and aromatic polyamide; imide-based polymers; sulfone-based polymers; polyether sulfone-based polymers; polyether ether ketone-based polymers; polyphenylene sulfide-based polymers; vinylidene chloride-based polymers; vinyl alcohol-based polymers; vinyl butyral-based polymers; arylate-based polymers; polyoxymethylene-based polymers; epoxy-based polymers; and mixtures of these polymers.

The thickness of the transparent support to be used is not particularly limited and is preferably about 10 µm to 200 µm, more preferably 10 µm to 100 µm, and still more preferably 20 µm to 90 µm.

In addition, the transparent support may be formed of a laminate of plural layers.

In order to improve the adhesion between the transparent support and a layer provided thereon (for example, the aforementioned optically anisotropic layer A, a polarizing film which will be described later, or the like), the transparent support may be subjected to a surface treatment (for example, glow discharge treatment, corona discharge treatment, treatment using ultraviolet rays (UV), or flame treatment).

An adhesive layer (undercoat layer) may be provided on the transparent support. In addition, in order to impart lubricity during a conveying step or to prevent adhesion between the rear surface and front surface after winding, the transparent support or a long transparent support is preferably provided with a polymer layer mixed with inorganic particles having an average particle diameter of about 10 to 100 nm at a solid weight ratio of 5% to 40% formed by coating or co-casting with the support on one side of the support.

<Additives of Transparent Support>

Various additives (for example, an optical anisotropy adjusting agent, a wavelength dispersion adjusting agent, fine particles, a plasticizer, an ultraviolet inhibitor, a deterioration preventive agent, a release agent, and the like) can be added to the transparent support. In addition, in the case in which the transparent support is a cellulose acylate film, the timing of adding the additives may be any time point in a step of preparing a dope (step of preparing a cellulose acylate solution), but a step of preparing the dope by adding the additives in the final stage in the step of preparing a dope may be carried out.

[Alignment Film]

In the optical laminate of the present invention, in the case in which the optical laminate has the aforementioned transparent support, an alignment film may be formed between the transparent support and the optically anisotropic layer.

The alignment film generally includes a polymer as a main component. The polymer material for the alignment film is described in many documents, and a large number of commercial products are available. As the polymer material used in the present invention, polyvinyl alcohol, polyimide, and derivatives of these are preferable. Particularly, modified or unmodified polyvinyl alcohol is preferable. Regarding the alignment film which can be used in the present invention, the modified polyvinyl alcohol described on p. 43, line 24 to p. 49, line 8 of WO01/88574A1 and in paragraphs [0071] to [0095] of JP3907735B can be referred to.

From the viewpoint of oxygen permeability, it is preferable that the alignment film has a small thickness. However, from the viewpoint of imparting an alignment ability for forming an optically anisotropic layer and from the viewpoint of forming an optically anisotropic layer having a uniform film thickness by mitigating the irregularity of the support surface, the alignment film needs to have a certain thickness. Specifically, the thickness of the alignment film is preferably 0.01 to 10 µm, more preferably 0.01 to 1 µm, and even more preferably 0.01 to 0.5 µm.

In the present invention, it is preferable to use an optical alignment film. The optical alignment film is not particularly limited, and it is possible to use those described in paragraphs [0024] to [0043] of WO2005/096041A, LPP-JP265CP (trade name) manufactured by Rolic technologies, and the like.

[Method of Producing Optical Laminate]

The method of producing an optical laminate is not particularly limited and for example, the an optical laminate can be prepared by appropriately selecting the aforementioned liquid crystal compound, alignment controlling agent, and the like so as to satisfy each surface energy of the aforementioned optically anisotropic layer A and optically anisotropic layer B, and forming one optically anisotropic layer (for example, optically anisotropic layer A) and then forming the other optically anisotropic layer (for example, optically anisotropic layer B) directly on the optically anisotropic layer.

Specifically, for example, in the case in which the optical laminate of the present invention has a transparent support, an optically anisotropic layer A, and an optically anisotropic layer B, which will be described later, in this order, the optical laminate can be prepared by the following steps (1) to (6). Regarding the conditions for application, heating treatment, curing treatment, rubbing, and the like in the following steps (1) to (6), each step in the method of producing a phase difference plate described in paragraphs [0129] to [0136] of WO2014/073616A above exemplified as a method of forming a λ/4 plate can be appropriately adopted.

Step (1): providing an alignment film on a transparent support

Step (2): applying a liquid crystal composition containing a liquid crystal compound A (for example, discotic liquid crystal compound) to the alignment film and carrying out a heating treatment as required to align the liquid crystal compound A Step (3): subjecting the liquid crystal compound A to a curing treatment to form an optically anisotropic layer A Step (4): carrying out rubbing on the optically anisotropic layer A Step (5): applying a liquid crystal composition containing another liquid crystal compound B (for example, rod-like liquid crystal compound) to the rubbed optically anisotropic layer A and carrying out a heating treatment as required to align the liquid crystal compound B Step (6): carrying out a curing treatment to the liquid crystal compound B to form an optically anisotropic layer B

[Polarizing Plate]

The polarizing plate of the present invention is a polarizing plate having the aforementioned optical laminate of the present invention and a polarizing film.

The polarizing plate of the present invention having the aforementioned configuration functions as a circular polarizing plate in an embodiment in which the aforementioned optical laminate of the present invention functions as a λ/4 plate (for example, a broadband λ/4 plate composed of a λ/4 plate and a λ/2 plate laminated on each other).

In such an embodiment, the polarizing plate of the present invention (circular polarizing plate) is suitably used for the purpose of anti-reflection for an image display device such as a liquid crystal display device, a plasma display panel (PDP), an electroluminescence display (ELD), or a cathode ray tube (CRT) and the contrast ratio of display light can be improved.

For example, an embodiment in which the circular polarizing plate of the present invention is used on the light extraction surface side of the organic EL display device may be used. In this case, external light is converted into linearly polarized light by a polarizing film, and then the linearly polarized light passes through a phase difference plate to be converted into circularly polarized light. The circularly polarized state is reversed when the circularly polarized light is reflected by a metal electrode and when the light passes through the phase difference plate again, the light is converted into linearly polarized light tilted at 90° from the time of light incidence and reaches a polarizing film to be absorbed. As a result, the effect of external light can be suppressed.

Figure 2A:
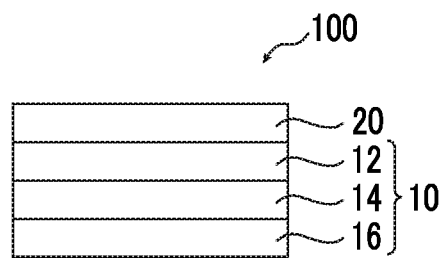
FIGS. 2A to 2C are schematic cross-sectional views showing examples of an embodiment of a polarizing plate according to the present invention, respectively.
Figure 2B:
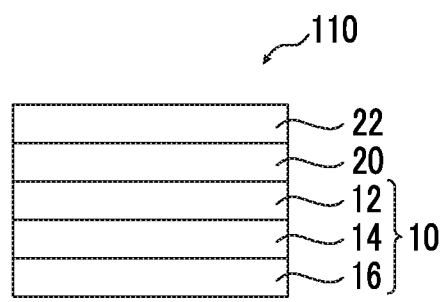
Figure 2C:
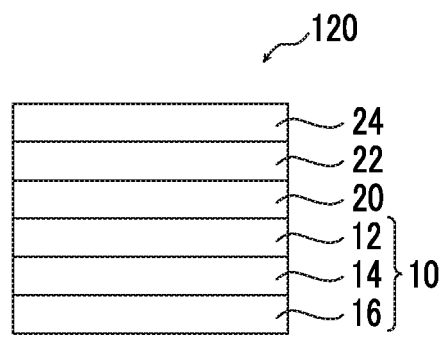

FIGS. 2A to 2C are schematic cross-sectional views showing examples of an embodiment of the polarizing plate of the present invention, respectively.

A polarizing plate 100 shown in FIG. 2A has an optical laminate 10 and a polarizing film 20.

As shown in FIG. 2B, a polarizing plate 110 may have a protective film 22 as well as the optical laminate 10 and the polarizing film 20.

Further, as shown in FIG. 2C, a polarizing plate 120 has an optical laminate 10, the polarizing film 20, the protective film 22, and a functional layer 24. As the functional layer 24, at least one selected from the group consisting of an antireflection layer, an antiglare layer, and a hardcoat layer may be used. Known layer materials may be used for these layers. These layers may be laminated in plural.

Hereinafter, among each layers constituting the phase difference plate of the present invention, layers other than the aforementioned optical laminate of the present invention will be described.

[Polarizing Film]

As the polarizing film (polarizer layer) having the polarizing plate of the present invention, any member can be used as long as the member has a function of converting natural light into specific linearly polarized light, and an absorption-type polarizer can be used.

The type of the polarizing film is not particularly limited and a polarizing film that is typically used can be used. For example, any of an iodine-containing polarizing film, a dye-based polarizing film using a dichromatic dye, and a polyene-based polarizing film can be used. The iodine-containing polarizing film and the dye-based polarizing film are generally prepared by allowing polyvinyl alcohol to adsorb iodine or a dichromatic dye and stretching the polyvinyl alcohol film.

The polarizing film is generally used in the form of a polarizing plate having a protective film laminated on both surfaces thereof.

[Protective Film]

The protective film that the polarizing plate of the present invention may have is not particularly limited and a typically used polymer film can be used.

Specific examples of polymers constituting the polymer film include cellulose-based polymers; acrylic polymers having an acrylic ester polymer such as polymethyl methacrylate and a lactone-ring containing polymer; thermoplastic norbornene-based polymers; polycarbonate-based polymers; polyester-based polymers such as polyethylene terephthalate and polyethylene naphthalate; styrene-based polymers such as polystyrene and an acrylonitrile-styrene copolymer (AS resin); polyolefin-based polymers such as polyethylene, polypropylene, and an ethylene-propylene copolymer; vinyl chloride-based polymers; amide-based polymers such as nylon and aromatic polyamide; imide-based polymers; sulfone-based polymers; polyether sulfone-based polymers; polyether ether ketone-based polymers; polyphenylene sulfide-based polymers; vinylidene chloride-based polymers; vinyl alcohol-based polymers; vinyl butyral-based polymers; arylate-based polymers; polyoxymethylene-based polymers; epoxy-based polymers; and mixtures of these polymers.

[Functional Layer]

As the functional layer that the polarizing plate of the present invention may have, for example, at least one selected from the group consisting of an antireflection layer, an antiglare layer, and a hardcoat layer may be used as described above. Known layer materials may be used for these layers. These layers may be laminated in plural.

For example, the simplest configuration for an antireflection layer is a configuration in which only a low refractive index layer is applied to the outermost surface of the film. Further, in order to lower the reflectivity, it is preferable that an antireflection layer is configured by combining a high refractive index layer having a high refractive index, and a low refractive index layer having a low refractive index. Examples of configurations include a configuration in which two layers of high refractive index layer/low refractive index layer are sequentially laminated from the lower side, and a configuration in which three layers having different refractive indexes are laminated in order of middle refractive index layer (layer having a refractive index higher than that of an underlayer and lower than that of a high refractive index layer)/high refractive index layer/low refractive index layer sequentially laminated. Further, a laminate of more antireflection layers is proposed. Among these, from the viewpoint of durability, optical properties, costs, and productivity, it is preferable to provide layers in order of middle refractive index layer/high refractive index layer/low refractive index layer on a hardcoat layer, and examples thereof include configurations described in JP1996-122504A (JP-1108-122504A), JP1996-110401A (JP-H08-110401A), JP1998-300902A (JP-H10-300902A), JP2002-243906A, and JP2000-111706A. In addition, an antireflection film having a three-layer configuration excellent in robustness to film thickness variation is described in JP2008-262187A. The average reflectivity of the antireflection film having a three-layer configuration can be set to 0.5% or less in the case in which the antireflection film is placed on the surface of an image display device, and reflected glare can be remarkably reduced. Thus, it is possible to obtain an image having excellent cubic effect. In addition, other functions may be imparted to each layer and examples thereof include an antifouling low refractive index layer, an antistatic high refractive index layer, an antistatic hardcoat layer, and an antiglare hardcoat layer, (for example, refer to JP1998-206603A (JP-H10-206603A), JP2002-243906A, and JP2007-264113A).

[Organic EL Display Device]

The organic EL display device of the present invention is an organic EL display device having the aforementioned optical laminate of the present invention or the polarizing plate of the present invention.

Figure 3A:
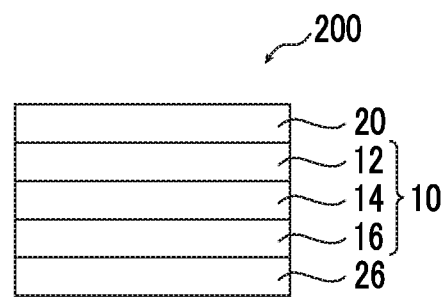
FIGS. 3A to 3C are schematic cross-sectional views showing examples of an embodiment of an organic EL display device according to the present invention, respectively.
Figure 3B:
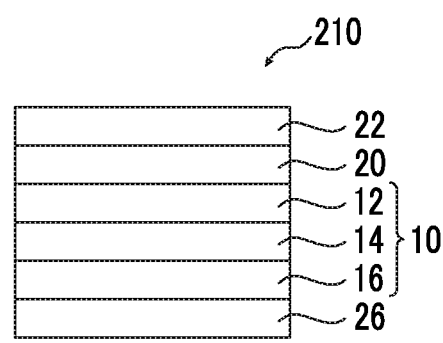
Figure 3C:
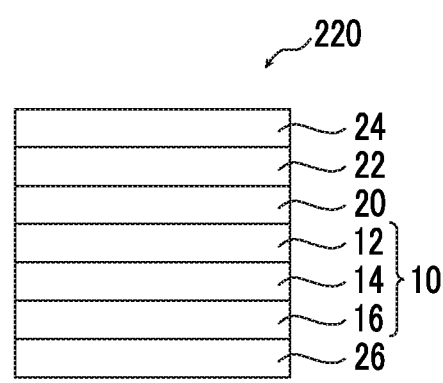

FIGS. 3A to 3C are schematic cross-sectional views showing examples of an embodiment of an organic EL display device according to the present invention, respectively.

The organic EL display device shown in FIG. 3A has at least an organic EL panel 26, the optical laminate 10, and the polarizing film 20.

In addition, as shown FIG. 3B, an organic EL display device 210 may further have the protective film 22 on the polarizing film 20 and as shown in FIG. 3C, an organic EL display device 220 may have the protective film 22 and the functional layer 24 on the polarizing film 20.

The organic EL panel is a member in which a light emitting layer or plural organic compound thin films including a light emitting layer are formed between one pair of electrodes of anode and cathode and may have a hole injecting layer, a hole transporting layer, an electron injecting layer, an electron transporting layer and a protective layer in addition to the light emitting layer. Each of these layers may have different functions. Various materials may be used for forming individual layers.

The anode supplies holes for a hole injecting layer, a hole transporting layer or a light emitting layer, a metal, an alloy, a metal oxide, an electrically conductive compound or a mixture thereof can be used, and materials having a work function of 4 eV or more are preferable. Specific examples thereof include conductive metal oxides such as tin oxide, zinc oxide, indium oxide and indium tin oxide (ITO), metals such as gold, silver, chromium and nickel, mixtures or laminates of the metals and the conductive metal oxides, inorganic conductive substances such as copper iodide and copper sulfide, organic conductive materials such as polyaniline, polythiophene and polypyrrole; and laminates thereof with ITO. Conductive metal oxides are preferable, and ITO is particularly preferred from the view of productivity, high conductivity and transparency. The film thickness of the anode can properly be selected depending on materials constituting the anode, but is typically preferably within the range of 10 nm to 5 μm, more preferably 50 nm to 1 μm, and still more preferably 100 nm to 500 nm.

EXAMPLES

Hereinafter, the present invention will be more specifically described based on examples. The materials, the amount of the materials used, the ratio between the materials, the content and the procedures of treatment, and the like shown in the following examples can be appropriately modified as long as the modification does not depart from the gist of the present invention. Accordingly, the scope of the present invention is not limited to the following specific examples.

Comparative Example 1

(1) Preparation of Cellulose Acylate Film (Preparation of Cellulose Ester Solution A-1)

The following composition was put into a mixing tank and was stirred while being heated to dissolve the respective components, thereby preparing a cellulose ester solution A-1.

Composition of Cellulose Ester Solution A-1

| | |
|---|---|
| Cellulose acetate (having an acylation degree of 2.86) | 100 parts by mass |
| Methylene chloride (first solvent) | 320 parts by mass |
| Methanol (second solvent) | 83 parts by mass |
| 1-Butanol (third solvent) | 3 parts by mass |
| Triphenyl phosphate | 7.6 parts by mass |
| Biphenyl diphenyl phosphate | 3.8 parts by mass |

(Preparation of Matting Agent Dispersion B-1)

The following composition was put into a disperser and was stirred to dissolve the respective components, thereby preparing a matting agent dispersion B-1.

Composition of Matting Agent Dispersion B-1

| | |
|---|---|
| Silica particle dispersion (having an average particle diameter of 16 nm) "AEROSIL R972", manufactured by Nippon Aerosil Co., Ltd. | 10.0 parts by mass |
| Methylene chloride | 72.8 parts by mass |
| Methanol | 3.9 parts by mass |
| Butanol | 0.5 parts by mass |
| Cellulose ester solution A-1 | 10.3 parts by mass |

(Preparation of Ultraviolet Absorber Solution C-1)

The following composition was put into another mixing tank and was stirred while being heated to dissolve the respective components, thereby preparing an ultraviolet absorber solution C-1.

Composition of Ultraviolet Absorber Solution C-1

| | |
|---|---|
| Ultraviolet absorber (UV-1 below) | 10.0 parts by mass |
| Ultraviolet absorber (UV-2 below) | 10.0 parts by mass |
| Methylene chloride | 55.7 parts by mass |
| Methanol | 10 parts by mass |
| Butanol | 1.3 parts by mass |
| Cellulose ester solution A-1 | 12.9 parts by mass |

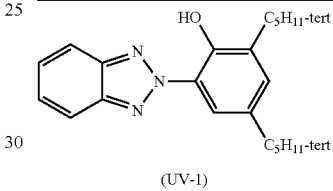

(UV-1)

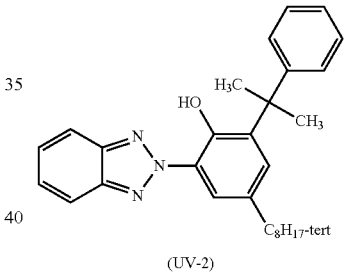

(UV-2)

(Preparation of Cellulose Acylate Film)

The ultraviolet absorber solution C-1 was added to a mixture of 94.6 parts by mass of the cellulose ester solution A-1 and 1.3 parts by mass of the matting agent dispersion B-1 such that each amount of the ultraviolet absorber (UV-1) and the ultraviolet absorber (UV-2) was 1.0 parts by mass per 100 parts by mass of cellulose acylate, and the obtained solution was sufficiently stirred while being heated to dissolve the respective components, thereby preparing a dope. The obtained dope was heated at 30° C. and was cast from a die onto a mirror-finished stainless steel support, which is a drum having a diameter of 3 m, through a casting geeser. The temperature of the surface of the support was cooled to −5° C. and the application width was set to 1,470 mm. The cast dope film was dried on the drum with dry air at 34° C. at a rate of 150 m³/min and in a state in which the ratio of the residual solvent was 150%, the film was peeled off from the drum. At the time of peeling, the film was stretched 15% in the transport direction (longitudinal direction). Thereafter, in a state in which both ends of the film in the width direction (direction orthogonal to the casting direction) were gripped by a pin tenter (pin tenter described in FIG. 3 in JP1992-1009A (JP-H04-1009A)), the film was transported. The stretching treatment was not carried out in the width direction. The film was then further dried by being transported between rolls of a heat treatment device, thereby producing a cellulose acylate film (T1). The amount of the residual solvent in the prepared long cellulose acylate film (T1) was 0.2%, the thickness was 60 μm, and Re and Rth at 550 nm were respectively 0.8 nm and 40 nm.

(2) Preparation of Optical Laminate (Alkali Saponification Treatment)

The aforementioned cellulose acylate film (T1) was allowed to pass between induction heating rolls at a temperature of 60° C. to increase the surface temperature of the film to 40° C. Then, an alkali solution of the following composition was applied to the band surface of the film in a coating amount of 14 ml/m$^2$ using a bar coater. The film was then transported for 10 seconds under a steam type infrared ray heater (manufactured by NORITAKE Co., Limited) heated to 110° C. Subsequently, pure water was applied in an amount of 3 ml/m$^2$ similarly using a bar coater. Next, after repeating 3 times the procedures of washing with water by a fountain coater and removing water by an air knife, the film was transported to a 70° C. drying zone to be dried for 10 seconds, and thus a cellulose acylate film subjected to an alkali saponification treatment was prepared.

Composition of Alkali Solution

| | |
|---|---|
| Potassium hydroxide | 4.7 parts by mass |
| Water | 15.8 parts by mass |
| Isopropanol | 63.7 parts by mass |
| Surfactant SF-1: $C_{14}H_{29}O(CH_2CH_2O)_{20}H$ | 1.0 part by mass |
| Propylene glycol | 14.8 parts by mass |

(Formation of Alignment Film)

An alignment film coating liquid (A) having the following composition was continuously applied to the surface of the cellulose acylate film (T1), which had been subjected to the alkali saponification treatment, using a #14 wire bar. The coated film was dried for 60 seconds with hot air at 60° C. and further dried for 120 seconds with hot air at 100° C. The saponification degree of modified polyvinyl alcohol used was 96.8%.

Composition of Alignment Film Coating Liquid (A)

| | |
|---|---|
| Modified polyvinyl alcohol below | 10 parts by mass |
| Water | 308 parts by mass |
| Methanol | 70 parts by mass |
| Isopropanol | 29 parts by mass |
| Photopolymerization initiator (Irgacure 2959, manufactured by CIBA Japan) | 0.8 parts by mass |

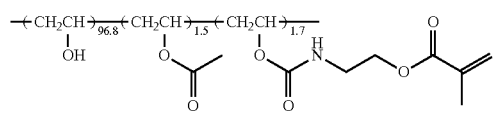

Modified Polyvinyl Alcohol (Formation of Optically Anisotropic Layer A)

The prepared alignment film was continuously subjected to a rubbing treatment. At this time, the longitudinal direction of the long film was parallel to the transport direction and an angle formed between the longitudinal direction of the film and the rotation axis of the rubbing roller was 75° (clockwise) (when the longitudinal direction of the film was 90°, the angle of the rotation axis of the rubbing roller was 15°).

An optically anisotropic layer coating liquid (A) including a discotic liquid crystal (DLC) compound and having the following composition was continuously applied to the prepared alignment film using a #5.0 wire bar. The transport velocity (V) of the film was 26 m/min. In order to dry the solvent of the coating liquid and to align and age the discotic liquid crystal compound, the coating liquid was heated for 90 seconds by hot air at a temperature of 115° C. Then, by heating the coating film at a temperature for 60 seconds and performing UV irradiation (amount of exposure: 70 mJ/cm$^2$) on the film at a temperature of 80° C., the alignment of the liquid crystal compound was fixed to form an optically anisotropic layer. The thickness of the optically anisotropic layer A was 2.0 μm. It was confirmed that the average tilt angle of the plane of the disk of the DLC compound to the plane of the film was 90° and the DLC compound was aligned to be vertical to the plane of the film. In addition, the angle of the slow axis was parallel to the rotation axis of the rubbing roller and was 15° when the longitudinal direction of the film was 90° (the width direction of the film was 0°).

Composition of Optically Anisotropic Layer Coating Liquid (A)

| | |
|---|---|
| Discotic liquid crystal compound (A) below | 80 parts by mass |
| Discotic liquid crystal compound (B) below | 20 parts by mass |
| Ethylene oxide-modified trimethylolpropane triacrylate (V#360, manufactured by OSAKA ORGANIC CHEMICAL INDUSTRY LTD.) | 10 parts by mass |
| Photopolymerization initiator (Irgacure 907, manufactured by CIBA Japan) | 3 parts by mass |
| Pyridinium salt (A) below | 0.9 parts by mass |
| Boric acid-containing compound below | 0.08 parts by mass |
| Polymer (A) below | 0.6 parts by mass |
| Fluorine-based polymer (FP1) below [alignment controlling agent] | 0.3 parts by mass |
| Methyl ethyl ketone | 183 parts by mass |
| Cyclohexanone | 40 parts by mass |

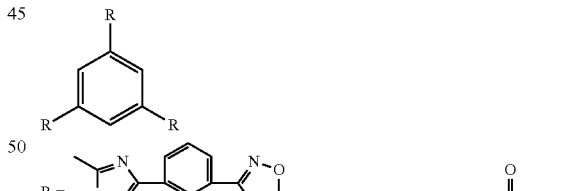

Discotic liquid crystal compound (A)

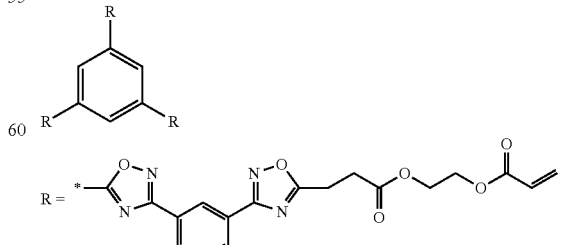

Discotic liquid crystal compound (B)

-continued

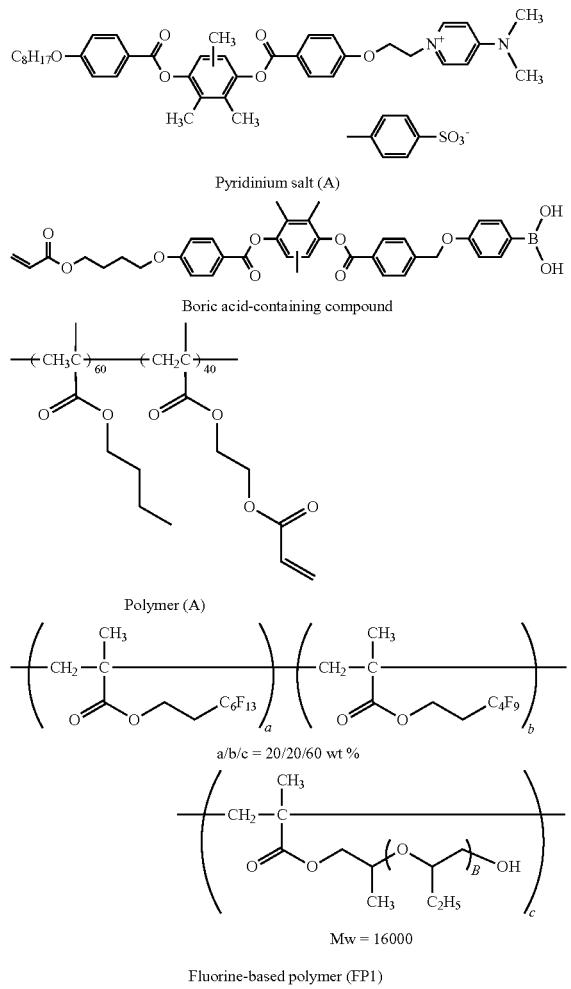

(Formation of Optically Anisotropic Layer B)

The prepared optically anisotropic layer A was continuously subjected to a rubbing treatment. At this time, the longitudinal direction of the long film was parallel to the transport direction and an angle formed between the longitudinal direction of the film and the rotation axis of the rubbing roller was −75° (counterclockwise) (when the longitudinal direction of the film was 900, the angle of the rotation axis of the rubbing roller was 165°).

An optically anisotropic layer coating liquid (B) including a rod-like liquid crystal compound and having the following composition was continuously applied to the optically anisotropic layer A, which had been subjected to a rubbing treatment, using a #2.8 wire bar. The transport velocity (V) of the film was 26 m/min. In order to dry the solvent of the coating liquid and to align and age the rod-like liquid crystal compound, the coating liquid was heated for 60 seconds by hot air at a temperature of 60° C. Then, by performing UV irradiation on the coating liquid at a temperature of 60° C., the alignment of the liquid crystal compound was fixed to form an optically anisotropic layer. The thickness of the optically anisotropic layer B was 0.8 μm. It was confirmed that the average tilt angle of the major axis of the rod-like liquid crystal compound to the plane of the film was 0° and the liquid crystal compound was aligned horizontally to the plane of the film. In addition, the angle of the slow axis was orthogonal to the rotation axis of the rubbing roller and was 75° when the longitudinal direction of the film was 900 (the width direction of the film was 0°).

The ratio of a repeating unit a (F part) with respect to the total amount of repeating units a and b of the following fluorine-based polymer (FP2) used in the following optically anisotropic layer coating liquid (B) is as shown in Table 1 below.

Composition of Optically Anisotropic Layer Coating Liquid (B)

| | |
|---|---|
| Mixture of rod-like liquid crystal compounds (A) below | 100 parts by mass |
| Photopolymerization initiator (Irgacure 907, manufactured by CIBA Japan) | 3 parts by mass |
| Sensitizer (Kayacure DETX, manufactured by Nippon Kayaku Co., Ltd.) | 1 part by mass |
| Fluorine-based polymer (FP2) below [alignment controlling agent] | 0.3 parts by mass |
| Methyl ethyl ketone | 337 parts by mass |

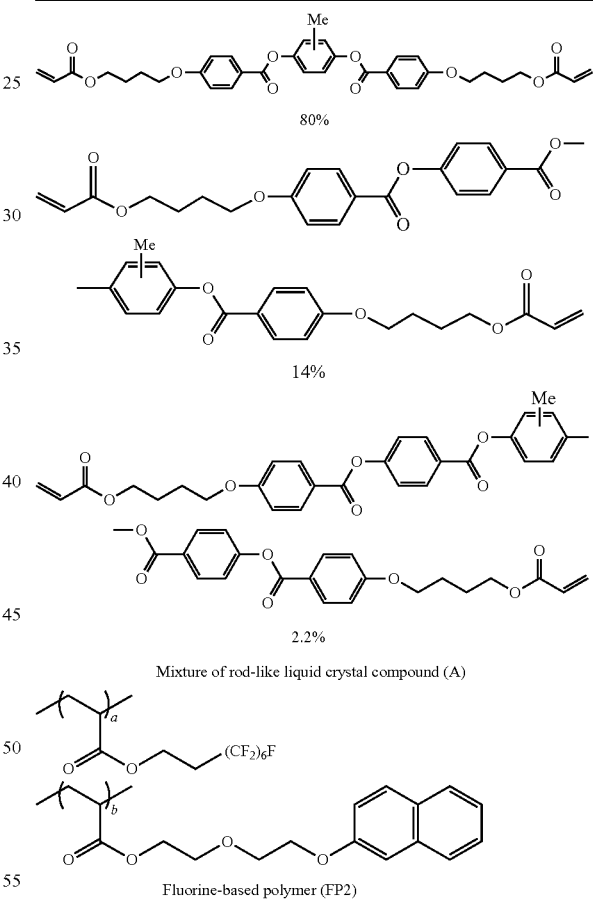

An optical laminate in which the optically anisotropic layer A formed of a discotic liquid crystal compound, and the optically anisotropic layer B formed of a rod-like liquid crystal compound were laminated on the cellulose acylate film (T1) as described above was prepared. The film was immersed in 1.5 mol/liter aqueous sodium hydroxide solution at 55° C. and then the sodium hydroxide was sufficiently washed with water. Then, the film was immersed in a 0.005 mol/liter dilute aqueous sulfuric acid solution at 35° C. for 1 minute and then immersed in water so that the dilute aqueous sulfuric acid solution was sufficiently washed off. Finally, the sample was sufficiently dried at 120° C.

Example 1

An optical laminate was prepared in the same manner as in Comparative Example 1 except that in the composition of the optically anisotropic layer coating liquid (B), 5 parts by mass of ethylene oxide-modified trimethylolpropane triacrylate (V#360, manufactured by OSAKA ORGANIC CHEMICAL INDUSTRY LTD.) was formulated as a non-liquid crystal monomer.

Comparative Example 2

An optical laminate was prepared in the same manner as in Comparative Example 1 except that in the composition of the optically anisotropic layer coating liquid (B), the fluorine-based polymer (FP2), as an alignment controlling agent, was not formulated.

Comparative Example 3

An optical laminate was prepared in the same manner as in Comparative Example 1 except that in the composition of the optically anisotropic layer coating liquid (B), the fluorine-based polymer (FP2), as an alignment controlling agent, was not formulated and ethylene oxide-modified trimethylolpropane triacrylate (V#360, manufactured by OSAKA ORGANIC CHEMICAL INDUSTRY LTD.), as a non-liquid crystal monomer, was formulated such that the amount thereof became 5% by mass with respect to the total solid content.

Example 2

An optical laminate was prepared in the same manner as in Comparative Example 1 except that in the composition of the optically anisotropic layer coating liquid (B), the ratio of the repeating unit a (F part) of the fluorine-based polymer (FP2), as an alignment controlling agent, was changed to the value shown in Table 1 below.

Examples 3 and 4

Optical laminates were prepared in the same manner as in Comparative Example 1 except that in the composition of the optically anisotropic layer coating liquid (B), the ratio of the repeating unit a (F part) of the fluorine-based polymer (FP2), as an alignment controlling agent, was changed to values shown in Table 1 below so that the amount added with respect to the total solid content was changed to the values shown in table 1 below.

Example 5

An optical laminate was prepared in the same manner as in Example 2 except that in the composition of the optically anisotropic layer coating liquid (B), 5 parts by mass of ethylene oxide-modified trimethylolpropane triacrylate (V#360, manufactured by OSAKA ORGANIC CHEMICAL INDUSTRY LTD.), as a non-liquid crystal monomer, was formulated.

Comparative Example 4

An optical laminate was prepared in the same manner as in Comparative Example 1 except that in the composition of the optically anisotropic layer coating liquid (B), instead of the fluorine-based polymer (FP2), as an alignment controlling agent, a fluorine-based polymer (FP3) represented by the following formula was formulated.

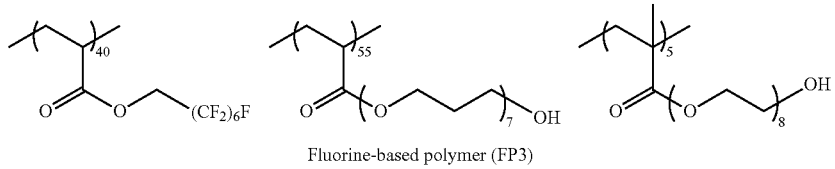

Fluorine-based polymer (FP3)

Comparative Example 5

An optical laminate was prepared in the same manner as in Comparative Example 1 except that in the composition of the optically anisotropic layer coating liquid (A), instead of the fluorine-based polymer (FP1), as an alignment controlling agent, the fluorine-based polymer (FP2) represented by the above formula was formulated.

Comparative Example 6

A laminated phase difference plate described in paragraphs [0181] to [0189] of JP2004-238431A was prepared as an optical laminate.

Comparative Example 7

An optical laminate was prepared in the same manner as in Comparative Example 6 except that in the composition of the optically anisotropic layer coating liquid (A) used in the production of the optical laminate in Comparative Example 6, the fluorine-based polymer (FP1) represented by the above Formula, as an alignment controlling agent, was formulated in the amount shown in Table 1 below with respect to the total solid content and in the composition of the optically anisotropic layer coating liquid (B), the fluorine-based polymer (FP2) represented by the above Formula, as an alignment controlling agent, was formulated in the amount shown in Table 1 below with respect to the total solid content.

Example 6

An optical laminate was prepared in the same manner as in Comparative Example 7 except that in the composition of the optically anisotropic layer coating liquid (B), 5 parts by mass of ethylene oxide-modified trimethylolpropane triacrylate (V#360, manufactured by OSAKA ORGANIC CHEMICAL INDUSTRY LTD.), as a non-liquid crystal monomer, was formulated.

<Surface Energy>

The optically anisotropic layer A and the optically anisotropic layer B of each optical laminate prepared above were peeled off by the aforementioned method. The surface energy A of the surface of the optically anisotropic layer A on the side in contact with the optically anisotropic layer B (ZA front surface), the surface energy B1 of the surface of the optically anisotropic layer B on the side in contact with the optically anisotropic layer A (ZB rear surface), and the surface energy B2 of the surface of the optically anisotropic layer B opposite to the side in contact with the optically anisotropic layer A (ZB front surface) were measured by the aforementioned method. The results thereof are shown in Table 1 below.

<Cissing>

The prepared optical laminate was placed between two polarizing plates arranged in a cross-nicol alignment and the number of cissings per 1 $m^2$ was visually counted. The results are shown in Table 1 below.

<Film Thickness Unevenness>

Each of the optical laminates prepared in Examples and Comparative Examples was placed between two polarizing plates arranged in a cross-nicol alignment at each stage of the time point when the optically anisotropic layer A was formed and the time point when the optically anisotropic layer B was formed, and the plane state of the surface (ZA front surface) of the optically anisotropic layer A and the surface (ZB front surface) of the optically anisotropic layer B was observed and evaluated based on the following criteria. The results are shown in Table 1 below.

A: Unevenness was not observed.

B: Slight unevenness could be confirmed but there was no problem in practical use.

C: Unevenness could be clearly confirmed.

TABLE 1

| | Optically anisotropic layer A | | | Optically anisotropic layer B | | | | |
|---|---|---|---|---|---|---|---|---|
| | Liquid crystal compound | Alignment controlling agent Type | % by mass | Liquid crystal compound | Non-liquid crystal monomer (% by mass) | Alignment controlling agent Type | % by mass | Ratio of F part (%) |
| Comparative Example 1 | DLC | FP1 | 0.3 | CLC | 0 | FP2 | 0.3 | 32.5 |
| Example 1 | DLC | FP1 | 0.3 | CLC | 5 | FP2 | 0.3 | 32.5 |
| Comparative Example 2 | DLC | FP1 | 0.3 | CLC | 0 | — | — | — |
| Comparative Example 3 | DLC | FP1 | 0.3 | CLC | 5 | — | — | — |
| Example 2 | DLC | FP1 | 0.3 | CLC | 0 | FP2 | 0.3 | 60 |
| Example 3 | DLC | FP1 | 0.3 | CLC | 0 | FP2 | 0.1 | 60 |
| Example 4 | DLC | FP1 | 0.3 | CLC | 0 | FP2 | 0.9 | 60 |
| Example 5 | DLC | FP1 | 0.3 | CLC | 5 | FP2 | 0.3 | 60 |
| Comparative Example 4 | DLC | FP1 | 0.3 | CLC | 0 | FP3 | 0.3 | — |
| Comparative Example 5 | DLC | FP2 | 0.3 | CLC | 5 | FP2 | 0.3 | 32.5 |
| Comparative Example 6 | CLC | — | 0.3 | CLC | 0 | — | — | — |
| Comparative Example 7 | CLC | FP1 | 0.3 | CLC | 0 | FP2 | 0.3 | 32.5 |
| Example 6 | CLC | FP1 | 0.5 | CLC | 5 | FP2 | 0.3 | 32.5 |

| | Surface energy | | | | | Film thickness unevenness | |
|---|---|---|---|---|---|---|---|
| | B2 ZB front surface | B1 ZB rear surface | A ZA front surface | Difference between surface energies B1 − B2 | Number of cissings [$m^2$] | ZB front surface | ZA front surface |
| Comparative Example 1 | 24.8 | 32.4 | 34.4 | 7.6 | 5.0 | B | B |
| Example 1 | 24.6 | 35.5 | 35.5 | 10.9 | 1.0 | B | B |
| Comparative Example 2 | 32.8 | 47.2 | 39.2 | 14.5 | 12.0 | C | B |
| Comparative Example 3 | 32.7 | 47.6 | 38.6 | 14.8 | 9.0 | C | B |
| Example 2 | 18.9 | 36.2 | 33.7 | 17.3 | 0.5 | A | B |
| Example 3 | 20.1 | 35.2 | 33.6 | 15.1 | 1.2 | B | B |
| Example 4 | 18.4 | 35.3 | 33.7 | 16.9 | 1.5 | A | B |
| Example 5 | 17.4 | 40.8 | 33.5 | 23.4 | 0.0 | A | B |
| Comparative Example 4 | 20.2 | 33.2 | 33.3 | 13.0 | 7.0 | B | B |
| Comparative Example 5 | 24.9 | 35.6 | 29.4 | 10.7 | 3.0 | B | A |
| Comparative Example 6 | 34.2 | 49.7 | 41.0 | 12.5 | 6.0 | C | C |
| Comparative Example 7 | 21.5 | 32.3 | 38.6 | 10.8 | 4.0 | B | B |
| Example 6 | 20.9 | 37.5 | 39.9 | 16.6 | 1.1 | B | B |

From the above results, it was found that in the optical laminates in Comparative Examples 1, 4, and 7 in which the surface energy B1 was less than 35 mN/m, cissing could be confirmed.

In addition, it was found that in all of the optical laminates in Comparative Examples 2, 3, and 6 in which the surface energy B2 was more than 25 mN/m, a large number of cissings were confirmed and film thickness unevenness was generated.

Further, it was found that in the optical laminate of Comparative Example 5 in which the surface energy A was less than 30 mN/m, cissing was confirmed.

In contrast, it was found that in all of the optical laminates in Examples 1 to 6 in which the surface energy A was within a range of 30 to 40 mN/m, the surface energy B1 was 35 mN/m or more, and the surface energy B2 was 25 mN/m or less, cissing was rarely observed and film thickness unevenness was also suppressed.

Particularly, in the comparison of Examples, it was found that in the optical laminates in Examples 2 and 5 a difference between the surface energy B1 and the surface energy B2 of the optically anisotropic layer B was 17 mN/m or more, cissing was further suppressed and the film thickness unevenness of the surface (ZB front surface) of the optically anisotropic layer B could be further suppressed. In the comparison of Examples 2 and 5, it was found that by incorporating the non-liquid crystal monomer having the same polymerizable group as the polymerizable group of the liquid crystal compound into the composition, cissing was further suppressed (Example 5).

EXPLANATION OF REFERENCES

10: optical laminate
12: transparent support
14: optically anisotropic layer A
16: optically anisotropic layer B
20: polarizing film
22: protective film
24: functional layer
26: display EL panel
100, 110, 120: polarizing plate
200, 210, 220: organic EL display device

What is claimed is:

1. An optical laminate comprising:
a transparent support;
an optically anisotropic layer A; and
an optically anisotropic layer B,
wherein the optically anisotropic layer A and the optically anisotropic layer B come into direct contact with each other,
either or both of the optically anisotropic layer A and the optically anisotropic layer B are formed of a composition containing a liquid crystal compound,
surface energy A of a surface of the optically anisotropic layer A on a side in contact with the optically anisotropic layer B is 30 to 40 mN/m,
surface energy B1 of a surface of the optically anisotropic layer B on a side in contact with the optically anisotropic layer A is 35 mN/m or more, and
surface energy B2 of a surface of the optically anisotropic layer B opposite to the side in contact with the optically anisotropic layer A is 25 mN/m or less, and
wherein the optical laminate includes the transparent support, the optically anisotropic layer A, and the optically anisotropic layer B in this order, with the transparent support being in direct contact with the optically anisotropic layer A.

2. The optical laminate according to claim 1,
wherein the optically anisotropic layer B is formed of a composition containing a liquid crystal compound.

3. The optical laminate according to claim 1,
wherein the optically anisotropic layer B is formed of a composition containing a liquid crystal compound,
the liquid crystal compound has a polymerizable group, and
the composition contains a non-liquid crystal monomer having the same polymerizable group as the polymerizable group of the liquid crystal compound.

4. The optical laminate according to claim 3,
wherein the polymerizable group is an acryloyloxy group or a methacryloyloxy group.

5. The optical laminate according to claim 1,
wherein a difference between the surface energy B1 and the surface energy B2 of the optically anisotropic layer B is 17 mN/m or more.

6. The optical laminate according to claim 2,
wherein a difference between the surface energy B1 and the surface energy B2 of the optically anisotropic layer B is 17 mN/m or more.

7. The optical laminate according to claim 3,
wherein a difference between the surface energy B1 and the surface energy B2 of the optically anisotropic layer B is 17 mN/m or more.

8. The optical laminate according to claim 4,
wherein a difference between the surface energy B1 and the surface energy B2 of the optically anisotropic layer B is 17 mN/m or more.

9. A polarizing plate comprising:
the optical laminate according to claim 1; and
a polarizing film.

10. A polarizing plate comprising:
the optical laminate according to claim 5; and
a polarizing film.

11. An organic EL display device comprising the optical laminate according to claim 1.

12. An organic EL display device comprising the optical laminate according to claim 5.

13. An organic EL display device comprising the polarizing plate according to claim 9.

14. An organic EL display device comprising the polarizing plate according to claim 10.

* * * * *